United States Patent [19]

Masuda

[11] Patent Number: 4,962,478

[45] Date of Patent: Oct. 9, 1990

[54] HIGH SPEED PROGRAMMABLE READ ONLY MEMORY DEVICE HAVING A HIGH INTEGRATION DENSITY AND DIODE IN THE PROGRAMMING PATH

[75] Inventor: Hajime Masuda, Tokyo, Japan

[73] Assignee: NEC Corporation, Tokyo, Japan

[21] Appl. No.: 421,876

[22] Filed: Oct. 13, 1989

[30] Foreign Application Priority Data

Oct. 13, 1988 [JP] Japan ................... 63-258641

[51] Int. Cl.$^5$ ............................................ G11C 17/00
[52] U.S. Cl. .................................. 365/96; 365/230.06
[58] Field of Search ...................... 365/230.06, 96, 204

[56] References Cited

U.S. PATENT DOCUMENTS

| | | | |
|---|---|---|---|
| 4,174,541 | 11/1979 | Schmitz | 365/96 |
| 4,385,368 | 5/1983 | Principi et al. | 365/96 |
| 4,424,582 | 1/1984 | Fukushima et al. | 365/230.06 |
| 4,656,606 | 4/1987 | Ohno et al. | 365/230.06 |
| 4,706,222 | 11/1987 | Kwiatkowski et al. | 365/230.06 |

FOREIGN PATENT DOCUMENTS

58-1885  1/1983  Japan ............... 365/230.06

Primary Examiner—Joseph E. Clawson Jr.
Attorney, Agent, or Firm—Sughrue, Mion, Zinn, Macpeak & Seas

[57] ABSTRACT

A programmable read only memory device according to the present invention has a plurality of memory cells each formed by, for example, a bipolar transistor or a series combination of a fuse element or a diode and associated with an addressing facility which has a plurality of row selector units coupled to word lines, respectively, and each of the row selector units has a decoder stage accompanied with an amplifying bipolar transistor and an output bipolar transistor coupled to the amplifying bipolar transistor for discharging a large amount of a write in current and a small amount of a read out current on the associated word line to the ground, wherein a diode is coupled between the associated word line and the amplifying bipolar transistor for supplying a part of the write in current through the amplifying bipolar transistor to the base node of the output bipolar transistor, so that the output bipolar transistor is decreased in transistor size by virtue of sharing the write in current between the collector node and the base node of the output bipolar transistor.

8 Claims, 5 Drawing Sheets

ROW ADDRESS BITS AND COMPLEMENTARY
ADDRESS BITS

HIGH SPEED PROGRAMMABLE READ ONLY MEMORY DEVICE HAVING A HIGH INTEGRATION DENSITY AND DIODE IN THE PROGRAMMING PATH

FIELD OF THE INVENTION

This invention relates to a programmable read only memory device, more particularly, to an addressing facility occupying a relatively small amount of real estate of a semiconductor chip.

DESCRIPTION OF THE RELATED ART

The programmable read only memory device provides a data storage where a user can memorize his data in a non-volatile manner after the fabrication of the memory device on a semiconductor chip. The programmable read only memory device forms part of various data processing system or a control unit, and serves as a part of the data storage.

Figure 1A:
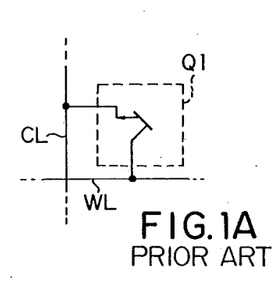
FIG. 1A is a circuit diagram showing a prior art programmable read only memory cell implemented by a bipolar transistor.
Figure 1B:
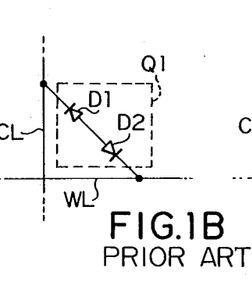
FIGS. 1B and 1C diagrams showing equivalent circuits of the programmable read only memory cell in different two states depending upon the logic level of a bit memorized therein.
Figure 1C:
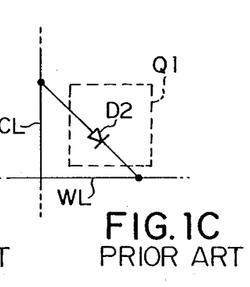

A typical example of the programmable memory cell is shown in FIG. 1A, and is implemented by a single bipolar transistor Q1 coupled at the emitter node thereof to a column line CL and at the collector node thereof to a row line WL. The memory cell thus implemented by the bipolar transistor is equivalent to two diodes D1 and D2 coupled in a back to back fashion as shown in FIG. 1B, and the two diodes D1 and D2 are formed by an emitter-base junction and a base-collector junction, respectively. If a large amount of current is supplied to the column line CL, the emitter-base junction is permanently broken down, and, for this reason, the programmable memory cell Q1 has only one diode D2 (or the base-collector junction) as shown in FIG. 1C. The programmable memory cell equivalent to the two diodes D1 and D2 is capable of blocking a small amount of current, however, the memory cell shown in FIG. 1C allows the current to flow from the column line CL to the row line WL, so that it is possible to make logic "1" and "0" levels correspond to the two different states shown in FIGS. 1B and 1C, respectively. Thus, the programmable read only memory cell has the two states corresponding to the logic "1" and "0" levels, the user can write a bit string into the memory cell array formed by the programmable memory cells by selective applications of the large amount of current.

Figure 2A:
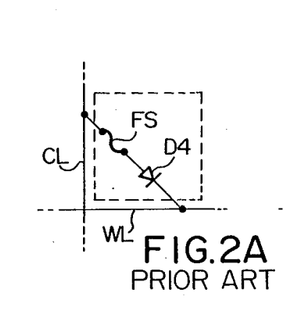
FIGS. 2A and 2B are circuit diagrams showing two prior art memory cells each implemented by a fuse element and a diode.
Figure 2B:
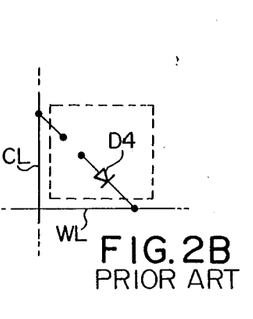

Another example of the programmable read only memory cell is illustrated in FIG. 2A. The programmable read only memory cell is implemented by a series combination of a fuse element FS and a diode D4, and the series combination is coupled between the column line CL and the word line WL. In this prior art example, the memorization of a data bit is also carried out by application of a large amount of current. Namely, when the large amount of current is supplied to the column line CL, the fuse element is thermally melted away, and, accordingly, only the diode D4 is left in the programmable read only memory cell as shown in FIG. 2B. If the programmable read only memory cell remains in the non-broken state shown in FIG. 2A, a small amount of current can flow from the column line CL through the memory cell to the word line WL. However, after application of the large amount of current, the memory cell does not relay the small amount of current from the column line CL to the word line WL. Thus, the programmable read only memory cell is established into either state shown in FIG. 2A or 2B, and the logic "1" and "2" levels are made correspond to the two different states.

Figure 3:
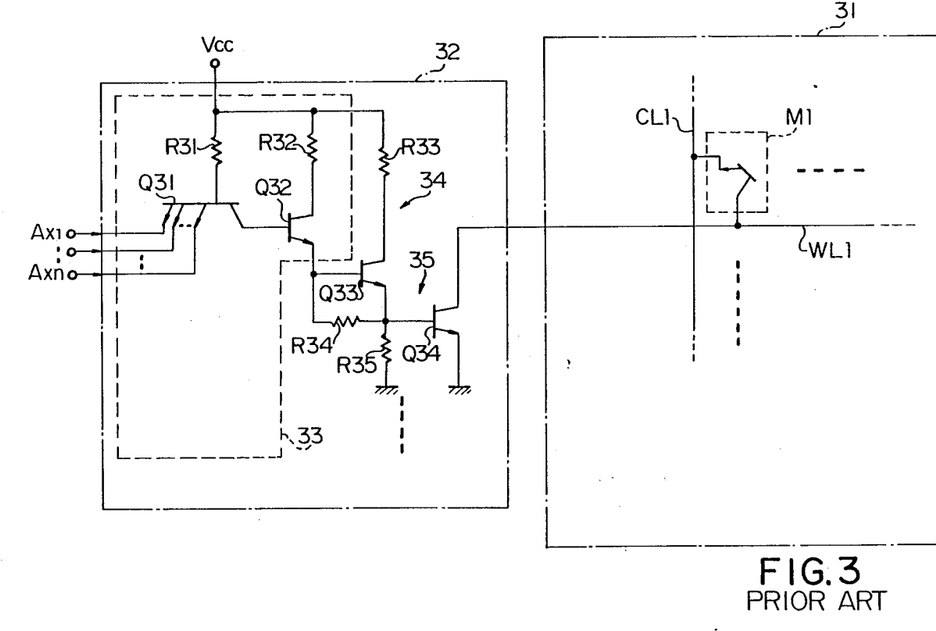
FIG. 3 is a circuit diagram showing the arrangement of a prior art row selector circuit associated with a row of the memory cells.

The programmable memory cells arranged in an array 31 is associated with an addressing facility as shown in FIG. 3, however, FIG. 3 shows one of the programmable memory cells M1 coupled at the emitter node thereof to a column line CL1 and at the collector node thereof to a word line WL1. The word line WL1 is coupled to a row selector circuit 32 which forms a part of a row selector unit provided for all of the word lines.

The row selector circuit 32 largely comprises a decoder stage 33, an amplifying stage 34 and an output stage 35. The decoder stage 33 has a multiple emitter n-p-n bipolar transistor Q31, a resistor R31 coupled between a constant voltage source Vcc and the base node of the multiple emitter n-p-n bipolar transistor Q31, an n-p-n bipolar transistor Q32 and a resistor R32 coupled between the source of the constant voltage level Vcc and the collector node of the n-p-n bipolar transistor Q32, and the row address bits Ax1 to Axr are supplied to the emitter nodes of the n-p-n bipolar transistor Q31, respectively. The base node of the n-p-n bipolar transistor Q32 is coupled to the collector node of the multiple emitter n-p-n bipolar transistor Q31. When all of the row address bits Ax1 to Axr are in the positive high voltage level, the multiple emitter n-p-n bipolar transistor Q31 turns off, and, accordingly, the base node of the n-p-n bipolar transistor Q32 is increased in voltage level at the base node thereof. This allows the n-p-n bipolar transistor Q32 to turn on, and a current path is established between the resistor R32 and the amplifying stage 34. However, if at least one of the row address bits Ax1 to Axr remains in the low voltage level, the multiple emitter n-p-n bipolar transistor Q31 provides a current path from the base node of the n-p-n bipolar transistor Q32 to the emitter node, and, for this reason, the base node of the n-p-n bipolar transistor Q32 is decreased in voltage level, which results in that the n-p-n bipolar transistor Q32 turns off to cut off the current path between the resistor R32 and the amplifying stage 34. Thus, the decoder stage 33 selectively provides the current path between the resistor R32 and the n-p-n bipolar transistor Q32 depending upon the bit string of the row address bits Ax1 to Axr.

The amplifying stage 34 is formed by a series combination of a resistor R33 and an n-p-n bipolar transistor Q33 as well as a resistor R34 coupled between the base and emitter nodes of the n-p-n bipolar transistor Q33. The output stage 35 has an n-p-n bipolar transistor Q34 the base node of which is coupled to the emitter node of the n-p-n bipolar transistor Q33, and a resistor R35 coupled between the base node of the n-p-n bipolar transistor Q34 and the ground node The resistors R31, R32 and R33 are selected to have respective resistances for providing forward biasing base emitter voltages to the n-p-n bipolar transistors Q31, Q32 and Q33, and the resistor R34 and R35 aim at compensating leakage currents.

When the current is suppled from the source of the constant voltage level Vcc through the resistor R32 and the n-p-n bipolar transistor Q32 to the base node of the n-p-n bipolar transistor Q33, the n-p-n bipolar transistor Q33 turns on to increase the voltage level at the base node of the n-p-n bipolar transistor Q34, and, accordingly, the n-p-n bipolar transistor Q34 turns on to discharge the word line WL1. The n-p-n bipolar transistor Q34 is large enough to discharge a large amount of current.

However, if no current is supplied to the base node of the n-p-n bipolar transistor Q33, the n-p-n bipolar transistor remains in the off state, and, for this reason, the base node of the n-p-n bipolar transistor Q34 is decreased in voltage level. This is causative of the transistor Q34 turned off, and no discharging path is established for the word line WL1.

The row selector circuit thus arranged is responsive to both of the read out mode of operation and the write in mode of operation. In the read out mode of operation, an address signal consisting of column address bits and the row address bits Ax1 to Axr is transferred to a column selector circuit (not shown) and the row selector circuit 32, respectively. The selected word line is grounded through the associated row selector circuit, but the discharging paths are blocked between the nonselected word lines and the ground by the associated row selector circuits. Assuming that the word line WL1 is selected, the n-p-n bipolar transistor Q34 is turned on. If the programmable memory cell M1 stores a bit of the logic "0" level, one of the p-n junctions has been destroyed, and a current fed to the column line CL1 is relayed to the word line WL1, so that an output circuit (not shown) decides the logic level of the bit memorized in the programmable memory cell M1 on the basis of the presence of the read out current on the column line CL1. In this situation, the amount of the current is measured to be about 1 milli-ampere. If, on the other hand, the programmable memory cell M1 memorizes a bit of logic "1" level, no p-n junction has been destroyed, and, the current fed to the column line CL1 can not flow into the word line WL1. Then, the output circuit decides that the bit is of the logic "1" level on the basis of the absence of the read out current on the column line CL1.

However, when the programmable read only memory device is established in the write in mode of operation, a large amount current is supplied to the selected column line CL1 If a logic "0" bit should be memorized in the programmable memory cell M1, the large amount of the current is supplied to the column line CL1, and all of the row address bits are in the positive high voltage level With the row address bits of the positive high voltage level, the multiple emitter n-p-n bipolar transistor Q31 turns off, and the n-p-n bipolar transistor Q32 in the on state allows the n-p-n bipolar transistor Q33 to turn on, which in turn allows the n-p-n bipolar transistor Q34 to turn on. Thus, the discharging path is provided through the n-p-n bipolar transistor Q34, and is causative of applying a large difference in a reverse biasing voltage across the memory cell M1 formed by the bipolar transistor. This results in destruction of the p-n junction, and the bit of the logic "0" level is memorized in the programmable memory cell. In the write in mode operation, the n-p-n bipolar transistor Q34 need to discharge the current of about 200 milliampere.

The n-p-n bipolar transistor Q34 of the output stage 35 discharge a relatively small amount of the current in the read out mode of operation, however, in the write in mode of operation, a large amount of the current flows through the transistor Q34, so that the n-p-n bipolar transistor is designed to be large in size for providing a large current driving capability. Then a problem is encountered in the prior art programmable read only memory device in that a large amount of area is consumed by the n-p-n bipolar transistor Q34 of the output stage 35. This is causative of increasing the chip size or of decreasing the integration density. The large n-p-n bipolar transistor Q34 deteriorates the current consumption due to a large amount of base current which is necessary in the write in mode of operation but is unnecessary in the read out mode of operation.

SUMMARY OF THE INVENTION

It is therefore an important object of the present invention to provide a read only memory device which is fabricated on a relatively small semiconductor chip.

It is also an important object of the present invention to provide a read only memory device which merely consumes a small amount of current.

To accomplish these objects, the present invention proposes to share the write in current between the collector node and the base node of an output bipolar transistor.

In accordance with the present invention, there is provided a programmable read only memory device having a read out mode of operation and a write in mode of operation, comprising: a) a plurality of memory cells arranged in rows and columns and having respective elements each capable of being permanently changed in resistance with a large amount of a write in current, each of the memory cells being operative to store a data bit of either logic "1" or "0" level depending upon the resistance of the element of the memory cell; b) a plurality of row lines respectively coupled to the rows of the memory cells; (c) a plurality of column lines respectively coupled to the columns of the memory cells; (d) column selector means coupled to the column lines and responsive to column address bits and the complementary address bits thereof for supplying one or a plurality of the column lines with the write in current in the write in mode of operation and with a small amount of a read out current in the read out mode of operation; (e) a row selector circuit having a plurality of row selector units respectively associated with the row lines, and responsive to row address bits and the complementary address bits thereof for selectively activating one of the row selector units, thereby providing a current path form associated one of the row lines to a first constant voltage source; and (f) an output circuit coupled to aforesaid one or plural column lines in the read out mode of operation to decide the voltage level or levels on the column line or lines for producing an output signal or signals representative of the data bit or bits stored in one or a plurality of the memory cells, in which each of the row selector units comprises (e-1) a decoder stage responsive to a combination of a part of the row address bits and a part of the complementary address bits thereof and operative to produce a control current, (e-2) an amplifier stage operative to turn on in the presence of the control current fed from the decoder stage for providing a conduction path, (e-3) an output stage including an output bipolar transistor having a base node coupled to a first end of the conduction path and capable of providing a collector to emitter conduction path between the associated word line and the first constant voltage source and a biasing resistor coupled between the base node of the output bipolar transistor and the first constant voltage source, and (e-4) a diode coupled between the associated word line and a second end of the conduction path.

BRIEF DESCRIPTION OF THE DRAWINGS

The features and advantages of a programmable read only memory according to the present invention will be more clearly understood from the following description taken in conjunction with the accompanying drawings in which.

DESCRIPTION OF THE PREFERRED EMBODIMENT

Figure 4:
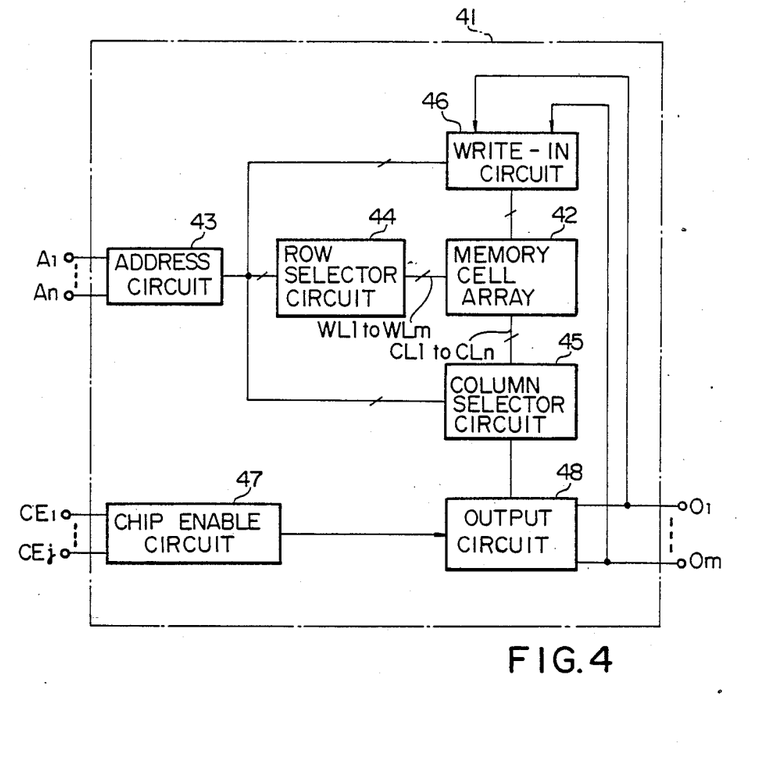
FIG. 4 is a block diagram showing the arrangement of a programmable read only memory device to which the present invention appertains.
Figure 5:
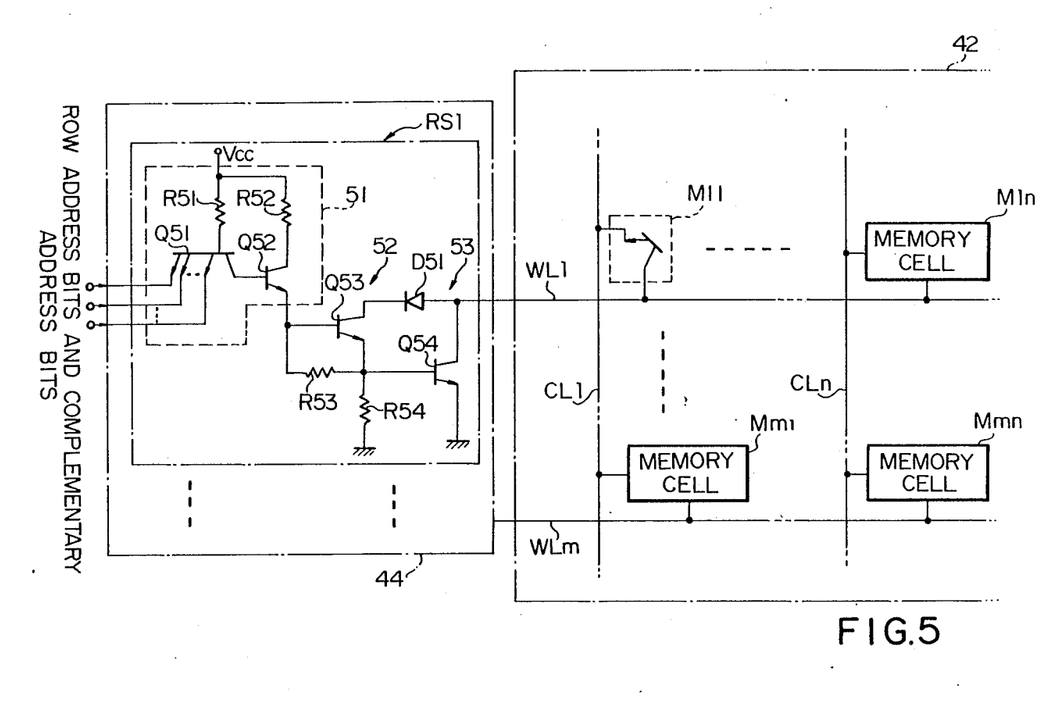
FIG. 5 is a circuit diagram showing the arrangement of a row selector circuit provided in association with a row of the memory cells incorporated in the programmable read only memory device shown in FIG. 4.

Referring first to FIG. 4 of the drawings, a programmable read only memory device according to the present invention is fabricated on a semiconductor chip 41, and comprises a memory cell array 42 having a plurality of programmable read only memory cells arranged in rows and columns. Although a large number of the programmable read only memory cells are incorporated in the array 42, only four memory cells M11, Mm1, M1n and Mmn are shown in FIG. 5, and each of the memory cells is implemented by a bipolar transistor. However, the bipolar transistor is replaceable with a series combination of a fuse element and a diode shown in FIG. 2A.

The memory cell array 42 is associated with a plurality of word lines WL1 to WLn as well as a plurality of column lines CL1 to CLn. Each of the word lines WL1 to WLn is coupled to each row of the memory cells, and each of the column lines CL1 to CLn is coupled to each column of the memory cells. Then, the memory cells are addressable with a combination of one word line and one column line. Data bits read out from the accessed memory cells appear on the associated column lines, and each of the data bits is in the form of either high or low voltage level. In this instance, the high and low voltage levels correspond to logic "1" and "0" levels.

Turning back to FIG. 4, a multiple-bit address signal consisting of row and column address bits A1 to An is supplied to an address circuit 43, and the address circuit 43 distributes the address bits A1 to An and the complementary address bits thereof to a row selector circuit 44 and a column selector circuit 45 in a read out mode of operation. However, the address circuit 43 supplies the row selector circuit 44 with the row address bits and the complementary address bits thereof, but the column address bits and the complementary address bits thereof are supplied to a write-in circuit 46 for providing a current path or paths from output pins 01 to Om to a selected column line or lines in a write in mode of operation. The row selector circuit 44 has a plurality of row selector units associated with the word lines WL1 to WLn, respectively, and each of the row selector units provides a discharging path from the associated word line to a ground node.

The programmable read only memory device shown in FIG. 4 further comprises a chip enable circuit 47 supplied with a multiple bit chip enable signal CE1 to CEj, and the chip enable circuit 47 shifts an output circuit 48 between an activated state and an inactivated state. If the output circuit 48 is activated in the read out mode of operation with the chip enable signal CE1 to CEj, the output circuit 48 produces output signals representative of the data bit or bits on the selected column line or lines, and the output signals are transferred from the output circuits 48 to the output pins 01 to Om. However, when the output circuit remains in the inactivated state in the write in mode of operation, no output signal takes place.

Turning to FIG. 5 of the drawings, one of the row selector units RS1 forming part of the row selector circuit 44 is coupled to the word line WL1, and the bipolar transistor of the memory cell M11 is coupled at the collector node thereof to the word line WL1 and at the emitter node thereof to the column line CL1. All of the row selector units RS1 to RSm are similar in circuit arrangement to one another, and, for this reason, the description is focussed upon the row selector unit RS1 only.

The row selector unit RS1 largely comprises a decoder stage 51, an amplifier stage 52, an output stage 53 and a diode D51. The decoder stage Q51 comprises a multiple emitter n-p-n bipolar transistor Q51 serving as a first n-p-n bipolar transistor and coupled at the emitter nodes thereof to row address nodes, a first resistor R51 coupled between a positive constant voltage source Vcc and the base node of the multiple emitter n-p-n bipolar transistor Q51, a second n-p-n bipolar transistor Q52 coupled at the base node thereof to the collector node of the multiple emitter n-p-n bipolar transistor Q51, and a second resistor R52 coupled between the positive constant voltage source Vcc and the collector node of the second n-p-n bipolar transistor Q52.

The amplifier stage 52 comprises a third n-p-n bipolar transistor Q53 coupled at the base node thereof to the emitter node of the second n-p-n bipolar transistor Q52, and a third resistor R53 coupled between the base and emitter nodes of the third n-p-n bipolar transistor Q53 for providing an appropriate forward biasing voltage therebetween.

The output stage 53 comprises a fourth n-p-n bipolar transistor Q54 capable of providing a collector-and-emitter current path between the word line WL1 and a ground node, and a fourth resistor R54 coupled between the base node of the fourth n-p-n bipolar transistor Q54 and the ground node for providing an appropriate forward biasing voltage between the base and emitter nodes of the fourth n-p-n bipolar transistor Q54. A diode has an anode coupled to the collector node of the fourth n-p-n bipolar transistor Q54 and a cathode coupled to the collector node of the third n-p-n bipolar transistor Q53.

Figure 6:
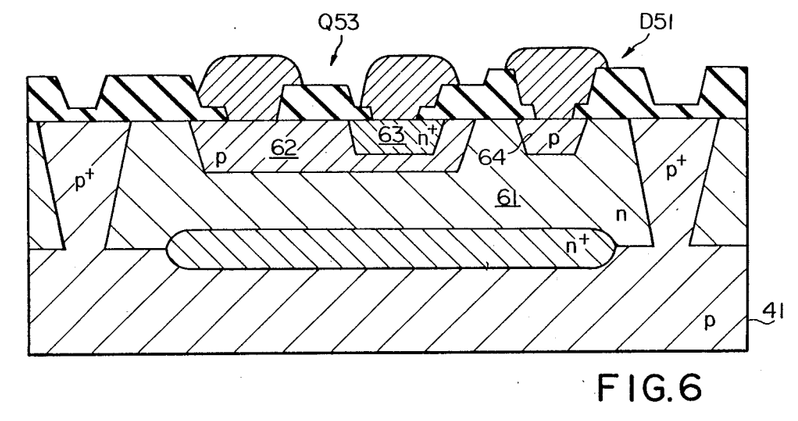
FIG. 6 is a cross sectional view showing the structure of a part of the programmable read only memory device shown in FIG. 4.

The diode D51 shares an occupation area with the third n-p-n bipolar transistor Q53. Namely, as shown in FIG. 6, the third n-p-n bipolar transistor Q53 is fabricated on the silicon substrate 41 and comprises a first n-type impurity region 61 for the collector, a first p-type impurity region 62 for the base, and a second n-type impurity region 63 for the emitter. In the first n-type impurity region 61 is formed a second p-type impurity region 64 which provides the anode of the diode D51. Then, the first n-type impurity region 61 partially serves as the cathode of the diode D51 and in part provides the collector of the third n-p-n bipolar transistor Q53. This results in reduction of the occupation area, and, accordingly, the integration density is increased.

Description is hereinbelow made for the write in mode and the read out mode of operation with the assumption that the address signal A1 to An specifies the memory cell M11.

In the write in mode of operation, all of the row address bits and the complementary address bits supplied to the emitter nodes of the n-p-n bipolar transistor Q51 are in the positive high voltage level, and the multiple emitter n-p-n bipolar transistor Q51 turns off. When the multiple emitter n-p-n bipolar transistor Q51 turns off, the base node of the second n-p-n bipolar transistor Q52 is increased in voltage level, and, accordingly, turns on to supply a current to the base node of the third n-p-n bipolar transistor Q53. This results in that the third n-p-n bipolar transistor Q53 turns on, however, the fourth n-p-n bipolar transistor Q54 remains in the off state due to insufficient base current.

The write-in circuit is responsive to the column address bits and the complementary address bits thereof as described hereinbefore, and a large amount of write-in current is transferred from the output pins 01 to Om to the column line CL1. With the large amount of the write in current, the base and emitter junction of the bipolar transistor of the memory cell M11 is damaged, and the write in current flows into the word line WL1. A data bit of "0" level is thus memorized in the memory cell M11. However, if a data bit of "1" level should be memorized, no write in current is supplied to the column line CL1, and the base and emitter junction is left in the bipolar transistor of the memory cell M11.

A part of the write in current passes through the diode D51, and the third bipolar transistor Q53 relays the part of the write in current to the base node of the fourth n-p-n bipolar transistor Q54. This results in that the base node of the fourth n-p-n bipolar transistor Q54 is increased in voltage level. When the collector node of the fourth n-p-n bipolar transistor Q54 reaches a certain voltage level equal to or larger than the total sum of the forward base and emitter biasing voltage Vbe54 of the fourth n-p-n bipolar transistor Q54, the forward biasing voltage Vd51 of the diode D51 and the collector and emitter voltage level Vce53 of the third n-p-n bipolar transistor Q53, the fourth n-p-n bipolar transistor Q54 turns on to discharge the write in current to the ground node. The voltage levels Vbe54, Vd51 and Vce53 are assumed to be about 0.8 volt, about 0.8 volt and about 0.3 volt, respectively, the certain voltage level is about 1.9 volt. Thus, the write in current is distributed to both of the base and collector nodes of the fourth n-p-n bipolar transistor Q54, and, for this reason, the fourth n-p-n bipolar transistor Q54 is rather small in size than the prior art bipolar transistor Q34 for the output stage. Assuming that the write in current is about 200 milli-ampere, the fourth n-p-n bipolar transistor Q54 consumes about 20 milli-ampere for the base current, so that the collector current of the fourth n-p-n bipolar transistor Q54 is merely about 180 milli-ampere. Moreover, the resistor R33 of the prior art example shown in FIG. 3 is deleted from the amplifier stage 52, and this further enhances the integration density. Namely, an usual bipolar transistor has an ohmic contact region in the collector region, and the ohmic contact region is replaced with the p type impurity region 64 for forming the diode D51, so that no additional area is consumed to form the diode D51. Then, the deleted resistor R33 is surely conducive to reduction of the occupation area of the read only memory device according to the present invention.

The first and second resistors R51 and R52 are relatively large in resistance, because a small base current is sufficient for allowing the third n-p-n bipolar transistor Q53 to pass the part of the write in current. This is conducive to reduction of the current consumption.

If the programmable read only memory device is established in the read out mode of operation, a relatively small amount of a read out current is supplied to the column line CL1, and the memory cell M11 relays the read out current to the word line WL1 if the data bit of "0" level is memorized therein. With the row address bits and the complementary address bits thereof, the multiple emitter n-p-n bipolar transistor Q51 allows the second n-p-n bipolar transistor Q52 to supply the base current to the fourth n-p-n bipolar transistor Q54. A relatively small base current permits the fourth n-p-n bipolar transistor Q54 to transfer a relatively small read out current from the word line WL1 to the ground node. When the fourth n-p-n bipolar transistor Q54 turns on, the base node or the cathode of the diode D51 becomes larger in voltage level than the collector or the anode of the diode D51, so that the diode D51 remains in the off state, and no read out current flows into the third n-p-n bipolar transistor Q53. If, on the other hand, the data bit of "1" is memorized in the memory cell M11, no read out current appears on the word line WL1.

As will be understood from the foregoing description, the programmable read only memory device according to the present invention is advantageous over the prior art programmable read only memory device in occupation area by virtue of the elimination of the resistor R33 and of the small fourth n-p-n bipolar transistor Q54. Moreover, the programmable read only memory device according to the present invention is further advantageous over the prior art programmable read only memory device in current consumption by virtue of the large resistances of the first and second resistors R51 and R52.

Although particular embodiments of the present invention have been shown and described, it will be obvious to those skilled in the art that various changes and modifications may be made without departing from the spirit and scope of the present invention.

What is claimed is:

1. A programmable read only memory device having a read out mode of operation and a write in mode of operation, comprising:
   (a) a plurality of memory cells arranged in rows and columns and having respective elements each capable of being permanently changed in resistance with a large amount of a write in current, each of said memory cells being operative to store a data bit of either logic "1" or "0" level depending upon the resistance of the element of the memory cell;
   (b) a plurality of row lines respectively coupled to the rows of said memory cells;
   (c) a plurality of column lines respectively coupled to the columns of said memory cells;
   (d) column selector means coupled to said column lines and responsive to column address bits and the complementary address bits thereof for supplying one or a plurality of said column lines with said write in current in said write in mode of operation and with a small amount of a read out current in said read out mode of operation;

(e) a row selector circuit having a plurality of row selector units respectively associated with said row lines, and responsive to row address bits and the complementary address bits thereof for selectively activating one of the row selector units, thereby providing a current path from one of said row lines to a first constant voltage source; and (f) an output circuit coupled to aforesaid one or plural column lines in said read out mode of operation to decide the voltage level or levels on the column line or lines for producing an output signal or signals representative of the data bit or bits stored in one or a plurality of the memory cells, in which each of said row selector units comprises (e-1) a decoder stage responsive to a combination of a part of said row address bits and a part of said complementary address bits thereof and operative to produce a control current, e-2) an amplifier stage operative to turn on in the presence of the control current fed from the decoder stage for providing a conduction path, (e-3) an output stage including an output bipolar transistor having a base node coupled to a first end of the conduction path and capable of providing a collector to emitter conduction path between said associated word line and said first constant voltage source and a biasing resistor coupled between the base node of the output bipolar transistor and the first constant voltage source, and (e-4)

a diode coupled between said associated word line and a second end of said conduction path.

2. A programmable read only memory device as set forth in claim 1, in which said decoder stage comprises a first multiple emitter bipolar transistor having a plurality of emitter nodes supplied with the part of said row address bits and the part of said complementary address bits, a first resistor coupled between a second constant voltage source and the base node of the first multiple emitter bipolar transistor, a second bipolar transistor having a base node coupled to the collector node of the first multiple emitter bipolar transistor, and a second resistor coupled between the second constant voltage source and the collector node of the second bipolar transistor.

3. A programmable read only memory device as set forth in claim 2, in which said amplifier stage comprises a third bipolar transistor having a base node coupled to the emitter node of the second bipolar transistor and a third resistor coupled between the base and emitter nodes of the third bipolar transistor.

4. A programmable read only memory device as set forth in claim 3, in which said first multiple emitter bipolar transistor, said second and third bipolar transistors and said output bipolar transistor are of the n-p-n bipolar transistor, and in which said first and second constant voltage sources respectively produces the ground voltage level and a positive voltage level.

5. A programmable read only memory device as set forth in claim 4, in which said diode has an anode coupled to the associated word line and a cathode coupled to the second end of the conduction path.

6. A programmable read only memory device as set forth in claim 5, in which each of said memory cells is formed by a bipolar transistor.

7. A programmable read only memory device as set forth in claim 5, in which each of said memory cells is formed by a series combination of a fuse element and a diode.

8. A programmable read only memory device fabricated on a semiconductor substrate of a first conductivity type and having a read out mode of operation and a write in mode of operation, comprising:

(a) a plurality of memory cells arranged in rows and columns and having respective elements each capable of being permanently changed in resistance with a large amount of a write in current, each of said memory cells being operative to store a data bit of either logic "1" or "0" level depending upon the resistance of the element of the memory cell;

(b) a plurality of row lines respectively coupled to the rows of said memory cells;

(c) a plurality of column lines respectively coupled to the columns of said memory cells;

(d) column selector means coupled to said column lines and responsive to column address bits and the complementary address bits thereof for supplying one or a plurality of said column lines with said write in current in said write in mode of operation and with a small amount of a read out current in said read out mode of operation;

(e) a row selector circuit having a plurality of row selector units respectively associated with said row lines, and responsive to row address bits and the complementary address bits thereof for selectively activating one of the row selector units, thereby providing a current path form one of said row lines to a first constant voltage source; and (f) an output circuit coupled to aforesaid one or plural column lines in said read out mode of operation to decide the voltage level or levels on the column line or lines for producing an output signal or signals representative of the data bit or bits stored in one or a plurality of the memory cells, in which each of said row selector units comprises e-1) a decoder stage responsive to a combination of a part of said row address bits and a part of said complementary address bits thereof and operative to produce a control current, said decoder stage comprising a first multiple emitter bipolar transistor having a plurality of emitter nodes supplied with the part of said row address bits and the part of said complementary address bits, a first resistor coupled between a second constant voltage source and the base node of the first multiple emitter bipolar transistor, a second bipolar transistor having a base node coupled to the collector node of the first multiple emitter bipolar transistor, and a second resistor coupled between the second constant voltage source and the collector node of the second bipolar transistor (e-2) an amplifier stage operative to turn on in the presence of the control current fed from the decoder stage for providing a conduction path, said amplifier stage comprising a third bipolar transistor having a base node coupled to the emitter node of the second bipolar transistor and a third resistor coupled between the base and emitter nodes of the third bipolar transistor. (e-3) an output stage including an output bipolar transistor having a base node coupled to a first end of the conduction path and capable of providing a collector to emitter conduction path between said associated word line and said first constant voltage source and a biasing resistor coupled between the base node of the output bipolar transistor and the first constant voltage source, and (e-4) a diode coupled between said associated word line and a second end of said conduction path, and in which said third bipolar transistor having a collector region of a second conductivity type formed on said semiconductor substrate, a base region of said first conductivity type formed in the collector region and an emitter region of the second conductivity type formed in the base region, wherein an impurity region of said first conductivity type is formed in a surface portion of said collector region for forming a combination said diode together with a part of the collector region.

* * * * *

UNITED STATES PATENT AND TRADEMARK OFFICE
CERTIFICATE OF CORRECTION

PATENT NO. : 4,962,478
DATED : October 9, 1990
INVENTOR(S) : Hajime Masuda

It is certified that error appears in the above-identified patent and that said Letters Patent is hereby corrected as shown below:

Column 2, line 1, delete " "2" " and insert--"0"--.

Signed and Sealed this

Twenty-seventh Day of October, 1992

*Attest:*

DOUGLAS B. COMER

*Attesting Officer*  Acting Commissioner of Patents and Trademarks